(12) United States Patent
Asada et al.

(10) Patent No.: US 8,089,997 B2
(45) Date of Patent: Jan. 3, 2012

(54) LASER DEVICE

(75) Inventors: Masahiro Asada, Zama (JP); Ryota Sekiguchi, Kawasaki (JP); Toshihiko Ouchi, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/908,237

(22) Filed: Oct. 20, 2010

(65) Prior Publication Data

US 2011/0032966 A1 Feb. 10, 2011

Related U.S. Application Data

(62) Division of application No. 12/339,362, filed on Dec. 19, 2008, now Pat. No. 7,839,910.

(30) Foreign Application Priority Data

Dec. 25, 2007 (JP) ................................. 2007-331275

(51) Int. Cl.
*H01S 5/34* (2006.01)
*H01S 5/062* (2006.01)

(52) U.S. Cl. ..................... 372/45.01; 372/44.01; 372/68; 977/951

(58) Field of Classification Search ............... 372/44.01, 372/45.01, 68; 977/951
See application file for complete search history.

(56) References Cited

U.S. PATENT DOCUMENTS

| | | | |
|---|---|---|---|
| 5,457,709 A | 10/1995 | Capasso et al. | 372/45 |
| 5,570,386 A | 10/1996 | Capasso et al. | 372/46 |
| 5,701,325 A | 12/1997 | Ouchi et al. | 372/96 |
| 6,046,096 A | 4/2000 | Ouchi et al. | 438/510 |
| 6,222,868 B1 | 4/2001 | Ouchi et al. | 372/50 |
| 6,400,744 B1 * | 6/2002 | Capasso et al. | 372/96 |
| 6,507,594 B1 | 1/2003 | Furukawa et al. | 372/36 |
| 6,836,579 B2 | 12/2004 | Ouchi | 385/14 |
| 7,839,910 B2 * | 11/2010 | Asada et al. | 372/45.01 |
| 2007/0008999 A1 * | 1/2007 | Breznay et al. | 372/45.01 |
| 2007/0280319 A1 * | 12/2007 | Sekiguchi et al. | 372/45.01 |
| 2008/0217538 A1 | 9/2008 | Ouchi et al. | 250/338.4 |

FOREIGN PATENT DOCUMENTS

JP 08-279647 A 10/1996

OTHER PUBLICATIONS

Masahiro Asada, "Density-Matrix Modeling of Terahertz Photon-Assisted Tunneling and Optical Gain in Resonant Tunneling Structures," Jpn. J. Appl. Phys., vol. 40, pp. 5251-5256, Part 1, No. 9A (Sep. 2001).

R. Köhler et al., "Terahertz semiconductor-heterostructure laser," Nature, vol. 417, pp. 156-159 (May 9, 2002).

(Continued)

*Primary Examiner* — Jessica Stultz
*Assistant Examiner* — Michael Carter
(74) *Attorney, Agent, or Firm* — Fitzpatrick, Cella, Harper & Scinto

(57) ABSTRACT

The laser device has a gain medium, first and second clads sandwiching the gain medium in the thickness direction, and a cavity structure for resonating the electromagnetic wave generated in the gain medium. The gain medium includes a plurality of active regions for generating an electromagnetic wave and at lease one connecting region sandwiched among the active regions. The first and second clads are each formed of a negative permittivity medium having a permittivity the real part of which is negative relative to the electromagnetic wave. A potential-adjusting portion is arranged between the connecting region and the first clad and between the connecting region and the second clad for adjusting the electric potential of the connecting region.

11 Claims, 7 Drawing Sheets

OTHER PUBLICATIONS

B.S. Williams et al. "Terahertz quantum-cascade laser at λ≈100 μm using metal waveguide for mode confinement," Appl. Phys. Lett., vol. 83, No. 11, pp. 2124-2126 (Sep. 15, 2003).

K.K. Choi et al., "Periodic negative conductance by sequential resonant tunneling through an expanded high-field superlattice domain," Phys. Rev. B., vol. 35, No. 8, pp. 4172-4175 (Mar. 15, 1987).

* cited by examiner

LASER DEVICE

CROSS REFERENCE TO RELATED APPLICATION

This application is a division of U.S. application Ser. No. 12/339,362, filed on Dec. 19, 2008 now U.S. Pat. No. 7,839,910, the entire disclosure of which is hereby incorporated by reference herein.

BACKGROUND OF THE INVENTION

1. Field of the Invention

This invention relates to a laser device. More specifically, the present invention relates to a quantum cascade laser device having repetitively arranged active regions. The present invention particularly relates to a quantum cascade laser device adapted to operate in a frequency band within a frequency range extending from the millimeter wave band to the terahertz band (30 GHz to 30 THz).

2. Description of the Related Art

New type semiconductor lasers based on intersubband transitions of carriers in the conduction band or in the valence band, hence within a single energy band, are known and referred to as quantum cascade lasers. Since the oscillation wavelength of a quantum cascade laser depends on the energy gap of two subbands involved in the optical transition, it can be selected from a broad spectral range (extending from the mid-infrared region to the terahertz band). Japanese Patent Application Laid-Open No. H08-279647 disclosed for the first time that such a laser can be realized by way of an arrangement of selecting an oscillation wavelength of 4.2 μm in the mid-infrared region.

Recently, longer wavelength lasers have been developed to exploit a long wavelength region relative to the mid-infrared region for the oscillation wavelength in order to meet the demand for electromagnetic wave resources of the terahertz band that is believed to be useful for biosensing applications. Nature, Vol. 417, 156 (2002), describes a laser oscillation at 67 μm (4.5 THz) in the terahertz band. Appl. Phys. Lett., Vol. 83, 2124 (2003), describes a laser oscillation at a longer wavelength of about 100 μm (3 THz), involving a surface plasmon waveguide, which includes a negative permittivity medium, the real part of permittivity thereof being negative for the oscillation wavelength.

The configuration of a quantum cascade laser will be summarily described below by referring to FIGS. 4A and 4B of the accompanying drawings, which also illustrate the band profiles employed in the example as will be described hereinafter.

FIG. 4A illustrates part of the conduction band structure when a designed electric field is applied to a quantum cascade laser. Referring to FIG. 4A, active region 440 is formed by barriers 441, 443 and 445 and quantum wells 442, 444 and 446. With this arrangement, subbands 411, 412 and 413 are formed in the active region 440. Relaxation region 450 is formed by barriers 451, 453, 455 and 457 and quantum wells 452, 454, 456 and 458. With this arrangement, a miniband 421 bundling a plurality of subbands is formed. Quantum cascade lasers are characterized in that active regions and relaxation regions are repetitively and alternately arranged. In FIG. 4A, active region 460 is the active region that appears next in the repetitive arrangement. When a designed electric field is applied to such a quantum cascade laser, an electric current occurs in a manner as described below.

Electrons make an optical transition 401 from the subband 411 to the subband 412 in the active region 440 to emit light of a wavelength that corresponds to the energy gap between the subband 411 and the subband 412. Subsequently, the electrons in the subband 412 of the active region 440 pass through the subband 413 due to optical phonon scattering 402 so as to be extracted into a relaxation region 450, securing the population inversion between the subband 411 and the subband 412. Then, the electrons pass through the miniband 421 in the relaxation region 450 and are injected into the next active region 460 to repeat the same optical transition as in the active region 440. The relaxation region 450 is referred to as "injector" because the relaxation region 450 injects carriers into the next repeated active region. One or more than one of the quantum wells in a relaxation region are slightly doped with carriers.

SUMMARY OF THE INVENTION

However, known quantum cascade lasers are accompanied by a risk that the applied voltage may not be uniformly distributed to the active regions that are cascade-connected in the laser. In other words, the electric field may not be uniformly distributed among the active regions as illustrated in FIG. 4B and show a difference from the designed electric field as illustrated in FIG. 4A. Such a phenomenon is described as formation of a high-field domain in a multiple quantum well structure in the conduction band or the valence band, hence in a single energy band, in Phys. Rev. B, Vol. 35, 4172 (1987).

It is believed that a high-field domain is apt to be formed when the energy broadening of subbands is narrow in a multiple quantum well structure. Therefore, formation of a high-field domain is a problem to long wavelength lasers for the reason as described below. Namely, a long wavelength laser requires two subbands showing a narrow energy gap for optical transitions. In other words, a narrow energy broadening of subbands needs to be designed for realizing population inversion. On the other hand, a narrow energy broadening of subbands should not be designed for the purpose of suppressing formation of a high-field domain. Thus, designing a long wavelength laser is accompanied by a problem of tradeoff between realization of population inversion and suppression of formation of a high-field domain.

If a high-field domain is formed, it degrades the laser oscillation characteristics. More specifically, if the electric field intensity varies among active regions, it may no longer be possible to inject carriers in a designed manner so that the density of population inversion can fall. Then, the current injection efficiency falls to by turn give rise to a risk of lowering the laser oscillation output and the drive temperature.

Thus, in the first aspect of the present invention, there is provided a laser device having: a gain medium; a first clad and a second clad sandwiching the gain medium in the thickness direction thereof; and a cavity structure for resonating an electromagnetic wave generated in the gain medium, the gain medium having a plurality of active regions for generating an electromagnetic wave and at least one connecting region laid among the active regions to connect the active regions, the active regions and the connecting region each including quantum wells and barriers, the first clad and the second clad each including a negative permittivity medium, the real part of permittivity thereof being negative for the electromagnetic wave, a potential-adjusting portion being arranged between the connecting region and the first clad and between the connecting region and the second clad, for adjusting the electric potential of the connecting region.

In the second aspect of the invention, there is provided a laser device including: a gain medium; a first clad and a second clad sandwiching the gain medium in the thickness direction thereof; and a cavity structure for resonating the electromagnetic wave generated in the gain medium, the electromagnetic wave having a frequency in a frequency range from 30 GHz to 30 THz, the gain medium having a plurality of active regions for generating an electromagnetic wave and at least one connecting region laid among the active regions to connect the active regions, the active regions and the connecting region each including quantum wells and barriers, the active regions being resonant tunneling diodes utilizing the photon assisted-tunneling phenomenon, the first clad and the second clad each including a negative permittivity medium, the real part of permittivity thereof being negative for the electromagnetic wave, a resistor being arranged between the connecting region and the first clad and between the connecting region and the second clad, for adjusting the electric potential of the connecting region, the voltages applied to the active regions arranged adjacent to the connecting region being equalized by adjusting the electric potential of the connecting region, the laser device being arranged on a substrate, the connecting region having a draw-out layer to be drawn out in the in-plane direction of the substrate and electrically connected to the resistor, the draw-out layer being carrier-doped and having a finite sheet resistance.

Thus, since a laser device according to the present invention has a potential-adjusting portion, the device can adjust the voltage applied to each of the active regions connected in a cascade manner. For example, the applied voltage can be substantially uniformly distributed among the active regions to consequently improve the current injection efficiency of the quantum cascade laser and hence the laser oscillation characteristics (including the laser oscillation output and the drive temperature).

According to the present invention, a potential-adjusting portion for suppressing formation of a high-field domain is structurally arranged as a separate part from its multiple quantum well structure. Then, the energy broadening of subbands can be reduced without the problem of tradeoff that arises when designing a long wavelength laser. Therefore, quantum cascade lasers that can operate at a still longer wavelength side can be designed.

Further features of the present invention will become apparent from the following description of exemplary embodiments with reference to the attached drawings.

DETAILED DESCRIPTION OF THE INVENTION

Figure 1A:
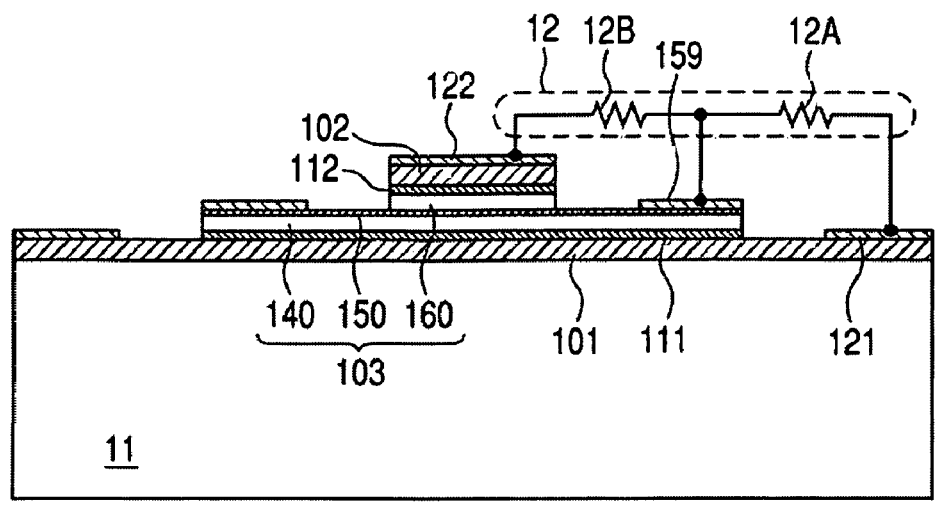
FIG. 1A is a schematic cross sectional view of an embodiment of laser device according to the present invention, illustrating the configuration thereof.

Now, the present invention will be described in greater detail by referring to the accompanying drawings that illustrate various embodiments of the present invention. FIG. 1A is a schematic cross sectional view of an embodiment of laser device according to the present invention taken perpendicularly relative to the direction of propagation of electromagnetic wave, illustrating the configuration thereof.

The laser device of this embodiment has a gain medium 103, a first clad and a second clad sandwiching the gain medium in the thickness direction thereof and a cavity structure for resonating electromagnetic waves generated in the gain medium. The gain medium by turn has a plurality of (two in this case) active regions 140 and 160 and at least one (one in this case) connecting region 150 interposed among (between) the active regions so as to connect the active regions. Note that not a single connecting region 150 but a plurality of connecting regions may be arranged in a laser device. For the purpose of the present invention, the concept of "connecting region" includes the concept of "relaxation region" mentioned above by referring to FIG. 4A. More specifically, a connecting region is adapted to inject carriers into an active region, as a relaxation region. However, for the purpose of cascade connection of the present invention, a connecting region may inject carriers into an active region by way of an energy relaxation process or not by way of an energy relaxation process. An active region and a connecting region both include quantum wells and barriers.

As will be described in greater detail hereinafter, both the first clad and the second clad are formed so as to include a negative permittivity medium, the real part of permittivity thereof being negative for electromagnetic waves generated in the gain medium. Thus, a waveguide is formed by the first clad and the second clad for the gain medium. The present invention is mainly characterized by the feature that a potential-adjusting portion is arranged between the connecting region and the first clad and between the connecting region and the second clad. With such an arrangement, by adjusting the electric potential of the connecting region, the voltages applied respectively to the active regions that are adjacently located at the opposite sides of the connecting region can be adjusted and equalized.

Now, the laser device of this embodiment and the characteristics thereof will be described in detail below.

The laser device has a gain medium 103 that extends along the direction of propagation of electromagnetic waves. The gain medium 103 includes a couple of active regions 140 and 160 that emit an electromagnetic wave, utilizing optical transitions. The gain medium 103 additionally has a connecting region 150. As pointed out above, the connecting region typically gives rise to a rapid energy relaxation to carriers coming from the preceding active region 140 and injects carriers into the succeeding active region 160. In the gain medium 103, the connecting region 150 shows an arrangement similar to that of a relaxation region of a known quantum cascade laser. The active regions 140 and 160 and the connecting region 150 have a net gain as a whole when a current injection takes place.

The gain medium 103 is sandwiched by a pair of negative permittivity mediums 101 and 102 in the thickness direction thereof. An electric contact needs to be established between the gain medium 103 and the negative permittivity mediums 101 and 102 when externally injecting an electric current. Contact layers 111 and 112 are provided for this purpose. The first (lower) clad is formed by the negative permittivity medium 101 and the contact layer 111, while the second (upper) clad is formed by the negative permittivity medium 102 and the contact layer 112.

A negative permittivity medium is a substance having a negative real part of permittivity in the frequency range of the electromagnetic wave to be oscillated. The negative permittivity medium is formed by a carrier-doped semiconductor, a metal or a plurality of substances including these substances (a metal and a carrier-doped semiconductor) in a frequency range extending from the millimeter wave band to the terahertz band. A transparent electroconductive film may be selected because a negative permittivity medium is typically an electroconductive material.

Since the gain medium 103 (the active regions 140 and 160 and the connecting region 150) has a semiconductor multilayer structure, a carrier-doped semiconductor is selected for the contact layers 111 and 112. As such a substance is selected for the contact layers 111 and 112, the negative permittivity mediums 101 and 102 and the contact layers 111 and 112 operate as a pair of clads having a geometrical optical reflecting surface. Surface plasmon having no diffraction limit is allowed as guided mode for the electromagnetic wave that is guided by the first clad (the negative permittivity medium 101 and the contact layer 111) and the second clad (the negative permittivity medium 102 and the contact layer 112).

Electrodes 121 and 122 are formed respectively on the negative permittivity mediums 101 and 102 and connected to an external field application section (not illustrated). In this embodiment, the connecting region 150 further has a draw-out layer drawn out in the transversal direction, which is the in-plane direction of the connecting region. The draw-out layer is held in contact with electrodes 159. Electric resistances 12A and 12B are electrically connected respectively between the electrode 121 and the electrode 159 and between the electrode 122 and the electrode 159 by means of a resistor 12. They operate as structure for substantially equally dividing the voltage applied by external field application to the active regions 140 and 160. In other words, the structure operates as a potential-adjusting portion arranged between the connecting region 150 and the first clad and also between the connecting region 150 and the second clad so as to adjust the electric potential of the connecting region 150. In FIG. 1A, numeral 11 denotes a transfer substrate.

Figure 1B:
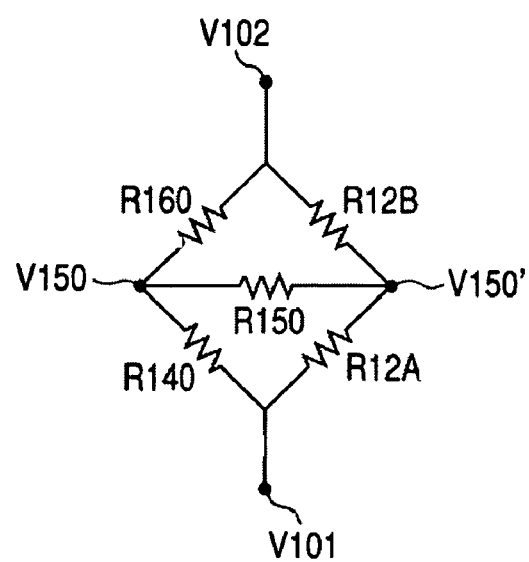
FIG. 1B is an equivalent electric circuit diagram of the embodiment of FIG. 1A.

FIG. 1B is an equivalent electric circuit diagram of the above described laser device. The voltage at the first clad (the negative permittivity medium 101 and the contact layer 111) having an electric potential substantially equal to the electric potential of the electrode 121 is denoted by V101 in FIG. 1B. Similarly, the voltage at the second clad (the negative permittivity medium 102 and the contact layer 112) having an electric potential substantially equal to the electric potential of the electrode 122 is denoted by V102 in FIG. 1B. The active regions 140 and 160 operate as so many loads and the load resistances are respectively denoted by R140 and R160 in FIG. 1B. The electric resistances 12A and 12B of the resistor 12 are respectively denoted by R12A and R12B in FIG. 1B.

The connecting region 150 is slightly carrier-doped. Therefore, the connecting region 150 has a limited sheet resistance, which is denoted by R150 in FIG. 1B. In this embodiment, the resistor 12 operates in a manner as described below by way of the limited sheet resistance. Generally, the electric potential of the connecting region 150 varies as a function of the spot therein due to the sheet resistance R150. In FIG. 1B, the voltage of the part of the connecting region 150 sandwiched by the active regions 140 and 160 is denoted by V150 and the voltage of the part of the connecting region 150 located near the electrode 159 is denoted by V150'. As is known in the field of analog circuit technologies, the equation of V150=V150' holds true for the voltages of the connecting region 150 when formula 1 shown below holds true.

$$R140 \times R12B = R160 \times R12A \qquad \text{(formula 1)}$$

While the above equation is cited as an example, it indicates that the value of V150 can be controlled by changing the electric resistances 12A and 12B of the resistor 12.

When the resistor 12 satisfies the requirement of the formula 1 and the electric resistances 12A and 12B are so low as to make the load resistances negligible and expressed by formula 2 shown below, the value of V150 can be controlled by controlling the electric potential of the resistor 12.

$$R12A < R140,\ R12B < R160 \qquad \text{(formula 2)}$$

Additionally, when the electric resistances 12A and 12B are equal to each other, or R12A=R12B, V150 is substantially at the middle between V102 and V101. Therefore, the voltage applied by external field application is divided substantially equally into the load resistance R140 and the load resistance R160. Thus, the resistor 12 can structurally suppress formation of a high-field domain in the gain medium 103.

The gain medium 103 of FIG. 1A so appears that it is formed by repetitively arranging two active regions. However, the gain medium 103 can be formed by repetitively arranging three or four active regions. Generally, the gain medium 103 can be formed by repetitively arranging a plurality of active regions. When the number of the repetitively arranged active regions is large, only the electric potentials of some of the connecting regions connected to the related active regions may be controlled. Generally, a potential-adjusting portion is arranged for at least a connecting region between the connecting region and the first clad and between the connecting region and the second clad.

The unit of repetition of an active region and a connecting region may be of the popular bound-to-continuum type, of the 4-well type or of the 3-well type. A resonant tunneling diode may be employed for each of the active regions. Then, a doped semiconductor layer having an appropriate thickness may be employed for the connecting region. A resonant tunneling diode that utilizes a photon-assisted tunneling phenomenon may be employed for each of the active regions. Any of them generates an electromagnetic wave gain in the frequency range of the millimeter wave band or the terahertz band when an electric current is injected.

While the resistor 12 is only abstractedly expressed above in the above description of the embodiment, a film resistor made of an electroconductive material may specifically be employed for the resistor 12, although the present invention is by no means limited thereto and a chip resistor can be a means operating for the potential-adjusting portion. Additionally, a chip inductor or a chip bead can also be employed as means for operating as the potential-adjusting portion because external field application is not limited to a DC. In other words, the potential-adjusting portion is only required to be arranged so as to connect a cascade connecting region and the related first clad and the cascade connecting region and the related second clad by DC connection or by AC connection. However, the use of a film resistor is preferable from the viewpoint of monolithically realizing the resistor 12. Note that an electroconductive material that can realize a relatively low resistance value is preferably used for such a film resistor. Examples of such materials include semimetals (e.g., Bi, graphite) and transparent electroconductive films (e.g., ITO, ZnO and ZnSn). A semiconductor showing a relatively high electric conductivity such as poly-Si may also be used for such a film resistor. The film resistor 12 may be continuously arranged along the direction of propagation of surface plasmon (the direction perpendicular to FIG. 1A) but alternatively it may be arranged in the form of a lumped constant element that is formed in an undistributed manner. Preferably, the loss for surface plasmon can be minimized by selecting nodes of the electromagnetic wave to be oscillated and arranging them in the form of a lumped constant element.

An external field control section having a sufficient drive capacity may well be utilized for driving such a laser device by taking the current injection to the gain medium 103 and the electric current flowing through the resistor 12 for suppressing formation of a high-field domain into consideration.

Thus, this embodiment can substantially uniformly distribute the voltage among the active regions cascade-connected with connecting regions interposed among them due to the above described potential-adjusting portion it has. The laser oscillation characteristics can be improved.

EXAMPLE

The present invention will be described further by way of examples particularly in terms of specific configurations.

Example 1

Figure 2:
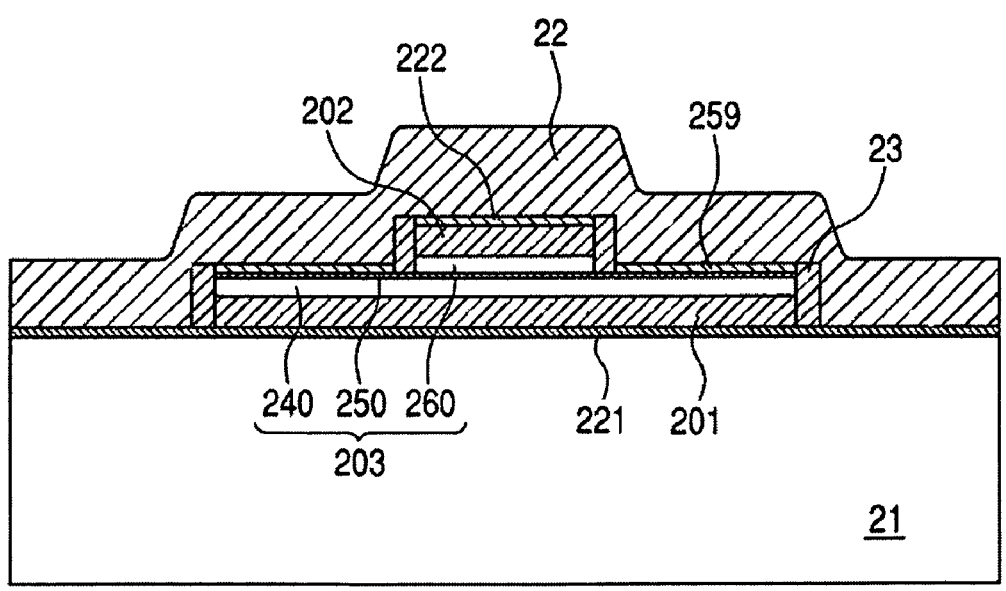
FIG. 2 is a schematic cross sectional view of the laser device of Example 1, illustrating the configuration thereof.
Figure 4A:
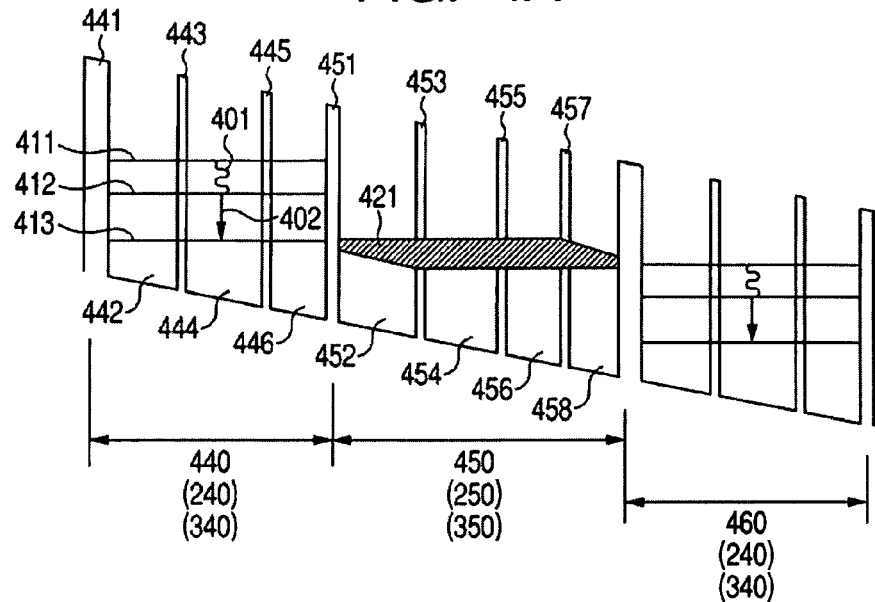
FIG. 4A is a diagram illustrating the band profile of the conduction band structure of the laser device of Example 1.
Figure 4B:
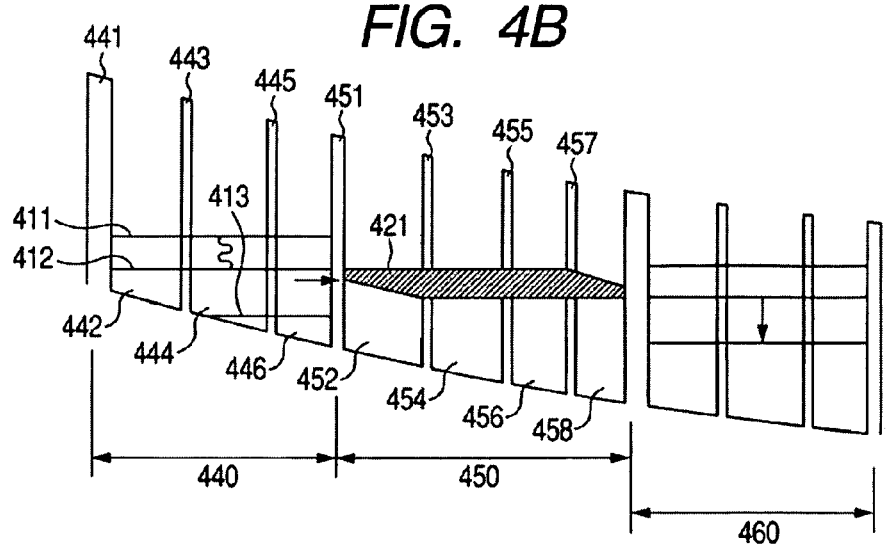
FIG. 4B is a diagram illustrating an exemplary band profile of the conduction band structure of a known laser device.

FIG. 2 is a schematic cross sectional view of the laser device of Example 1 taken perpendicularly relative to the direction of propagation of electromagnetic wave. In this Example, the gain medium 203 has a configuration of repetitively arranging two active regions 240 and 260 that can be used for a quantum cascade laser. Thus, there is a single cascade connecting region 250 arranged between the active regions 240 and 260. The profile of the bands is designed as a bound-to-continuum type multiple quantum well structure as illustrated in FIG. 4A. As for these regions, a lattice-matched GaAs well layer and a lattice-matched or lattice-unmatched AlGaAs barrier layer may be formed on a GaAs substrate.

More specifically, a semiconductor multilayer film structure as shown below may be arranged from the emitter side to the collector side as a unit of repetition (cited from Nature, Vol. 417, 156 (2002)). AlGaAs 4.3 nm (441)/GaAs 18.8 nm (442)/AlGaAs 0.8 nm (443)/GaAs 15.8 nm (444)/AlGaAs 0.6 nm (445)/GaAs 11.7 nm (446)/AlGaAs 2.5 nm (451)/GaAs 10.3 nm (452)/AlGaAs 2.9 nm (453)/GaAs 10.2 nm (454)/AlGaAs 3.0 nm (455)/GaAs 10.8 nm (456)/AlGaAs 3.3 nm (457)/GaAs 9.9 nm (458).

Of the above, from the top layer to the 2.5 nm-thick AlGaAs 451 layer are active regions 240 and 260 and from the 2.5 nm-thick AlGaAs 451 layer to the bottom layer constitute a connecting region 250. The 10.2 nm-thick n-GaAs 454 layer is a carrier-doped injector layer that shows a slight electron density of about $4 \times 10^{16}$ cm$^{-3}$. The other layers are undoped layers which are not intentionally doped.

In this example, the 10.2 nm-thick n-GaAs layer 454 in the cascade connecting region 250 is a draw-out layer. The carriers (electrons are chosen here) injected from the emitter produce an electric current showing a current density of about 1 kA/cm$^2$ when an electric field of about 3.5 kV/cm is uniformly applied to the above semiconductor multilayer film structure to produce a gain in a frequency range of the terahertz band due to intersubband transitions. The gain medium 203 is sandwiched between negative permittivity mediums 201 and 202 that also operate as contact layers. The contact layers 201 and 202 of the gain medium 203 are typically formed by means of a semiconductor film of n-GaAs (200 nm thick) that is lattice-matched to the GaAs substrate. An electron density of $5 \times 10^{18}$ cm$^{-3}$ is selected here. The gain medium 203 and the negative permittivity mediums 201 and 202 are formed on the GaAs substrate typically by means of a semiconductor epitaxial growth. FIG. 2 illustrates the structure produced after transferring these epitaxial layers onto a transfer substrate 21. The GaAs substrate is already removed and the negative permittivity mediums 201 and 202 are held in contact with respective electrodes 221 and 222 typically made of Ti/Au.

However, it should be noted that only an example of structure that can be formed on a GaAs substrate is described above and the present invention is by no means limited thereto. A semiconductor multilayer structure of arranging InAs/AlAsSb on an InAs substrate, arranging InGaAs/InAlAs, InGaAs/AlAs or InGaAs/AlGaAsSb on an InP substrate or arranging Si/SiGe on an Si substrate is also feasible. When Si/SiGe arranged on an Si substrate is utilized, holes may be used as carriers.

The surface plasmon waveguide as described above is typically made to show a length of 1,000 μm in the direction of propagation of surface plasmon and a width of 20 μm in a direction transversal to the above direction. The draw-out layer 454 is drawn out in the transversal direction by 50 μm. Then, the load resistance of the active regions 240 and 260 is of the order of 0.1Ω. If the above formula 2 is made applicable to the resistor 22 for the purpose of simplicity, a resistor showing a resistance lower than the load resistance may well be used for the resistor 22. A ribbon-shaped resistor arranged to cross the surface plasmon waveguide as illustrated in FIG. 2 is adopted here. When a Bi film was formed by evaporation, the film showed a resistivity of about 3 Ω·μm. Therefore, when the ribbon-shaped Bi film resistor 22 is made to show a thickness of 1 μm and a width (the length in the direction of propagation of surface plasmon) of 3 μm or more, the following results are obtained. Namely, both the resistance value between the electrode 221 and the electrode 259 on the draw-out layer 454 and the resistance value between the electrode 222 and the electrode 259 are equal to each other and of the order of 0.01Ω or less so that the requirement of the formula 2 is satisfied. The passivation film 23 for protecting the lateral wall of the laser device has a film thickness of about 200 nm. Thus, the Bi film resistor 22 structurally suppresses formation of a high-field domain in the gain medium 203 as described above by referring to the embodiment. The passivation film 23 and the electrode 259 may typically be made of SiO$_2$ and Ti/Au respectively.

The laser device of this example can be prepared in a manner as described below. Firstly, an etch-stop layer of AlGaAs is formed by molecular beam epitaxy (MBE) and an n-GaAs layer 202, a GaAs/AlGaAs multiple quantum well layer 203 and an n-InGaAs layer 201 are formed on a GaAs substrate by epitaxial growth. Then, after forming an electrode 221 of Ti/Au on the surface thereof by evaporation, the GaAs substrate is polished to a thickness of about 120 μm. Thereafter, a 1,000 μm cubic chip is formed from the work by cleavage and the electrode 221 and the Au thin film formed on a transfer substrate 21, on which a Ti/Au thin film is formed by evaporation, are bonded to each other by way of a pressure bonding process. Alternatively, they may be bonded to each other by way of a heat bonding process, using solder of AuSn for example. Only the GaAs substrate is selectively etched out up to the etch-stop layer when the work is subjected to a wet etching process, using ammonia water and aqueous hydrogen peroxide. Then, a mesa-shaped epitaxial layer is transferred onto the transfer substrate 21.

Subsequently, a 50 µm-wide mesa shape is produced by photolithography and dry etching until the underlying layer is exposed. Thereafter, a 20 µm-wide mesa shape is produced by etching to expose the draw-out layer 454, following a similar process. A Degilem may be used to measure the etching depth in-situ for the purpose of realizing a highly accurate etching process. A selective wet etching process may be adopted here.

As a result of the above-described process, a stripe-shaped waveguide having a cavity length of 1,000 µm and cleavage planes arranged at the opposite ends is formed as cavity structure. Subsequently, a $SiO_2$ film 23 is formed typically by plasma CDV and then the mesa-shaped epitaxial layer is exposed except a lateral wall. The lateral wall can be left by etching, opening a stripe-shaped window having a width of 50 µm or less by patterning. Additionally, a Ti/Au electrode 222 and another Ti/Au electrode 259 are formed respectively on the surface of the n-GaAs layer 202 and on the surface of the draw-out layer 454 in the connecting region 250 by way of a lift-off process. Finally, a Bi film resistor 22 is formed by way of a lift-off process to produce a complete device. An electric current flows as described above by referring to FIG. 4A when a predetermined electric field is applied to the quantum cascade laser.

Figure 3A:
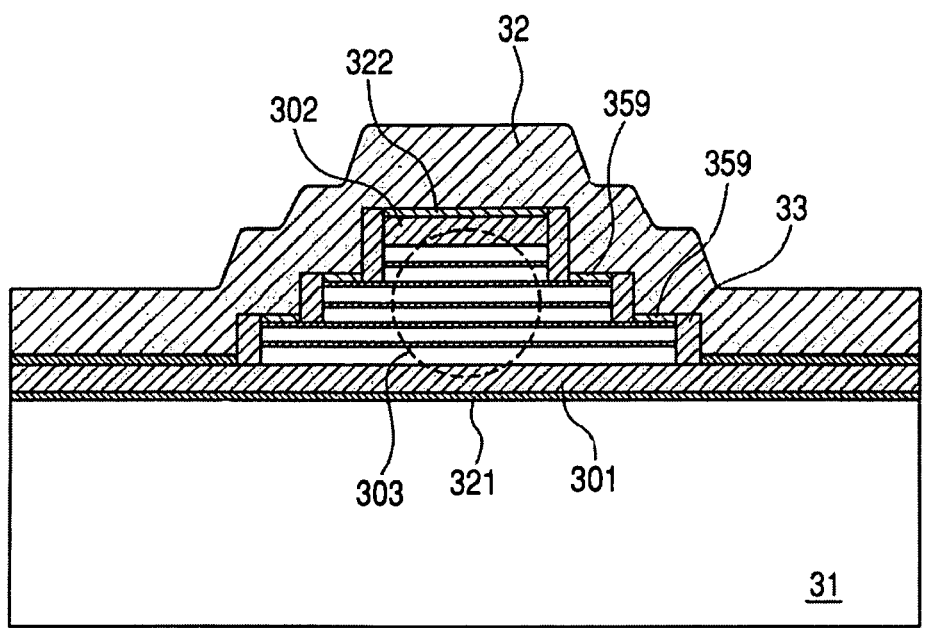
FIG. 3A is a schematic cross sectional view of a laser device realized by modifying the laser device of Example 1.
Figure 3B:
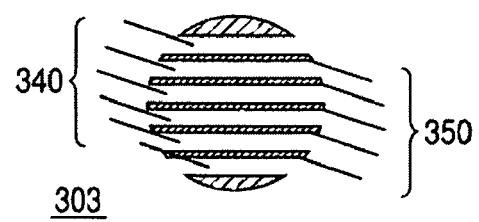
FIG. 3B is an enlarged view of the gain medium of the laser device of FIG. 3A.

Alternatively, three or more than three active regions may be repetitively arranged. FIG. 3A is a schematic cross sectional view of a laser device realized by modifying the laser device of Example 1. A total of six active regions 340 are repetitively arranged there. FIG. 3B is an enlarged view of the gain medium 303 of the laser device of FIG. 3A. Thus, the device has five connecting regions 350. In this modified example, not all but two connecting regions 350 are drawn out and held in contact with a resistor 32 in order to reduce the number of manufacturing steps. With this arrangement, formation of a high-field domain in the gain medium 303 can be suppressed if compared with an arrangement where no resistor 32 is added.

The ratio of the resistance value of the resistor 32 arranged between the (upper) electrode 359 on the connecting region 350 and the electrode 322 on the clad (negative permittivity medium 302) to the resistance value of the resistor 32 arranged between the electrode 359 and the electrode on the clad (negative permittivity medium 301) is determined in a manner as described below. While there are two active regions 340 between the connecting region 350 and the negative permittivity medium 302, there are four active regions 340 between the connecting region 350 and the negative permittivity medium 301. Thus, the ratio is equal to 1:2. Similarly, the ratio of the resistance values of the two resistors 32 is determined in a manner as described below. The ratio of the resistance value of the resistor 32 between the (lower) electrode 359 on the connecting region 350 and the electrode 322 on the clad (negative permittivity medium 302) to the resistance value of the resistor 32 between the electrode 359 and the clad (negative permittivity medium 301) is determined substantially equal to 2:1. In this way, the voltage applied by external field application is substantially equally divided to the pairs of active regions 340 arranged side by side with a connecting region 350 interposed between them to produce a structure that can suppress formation of a high-field domain in the gain medium 303. In FIG. 3A, numeral 31 denotes a transfer substrate and numeral 33 denotes a passivation film for protecting the lateral wall, while 321 denotes an electrode.

As for the ratio of the resistance values, if there are m active regions between the connecting region and the first clad and n active regions between the connecting region and the second clad, the ratio of the resistance value of the resistor arranged between the former components to the resistance value of the resistor arranged between the latter components is determined to be substantially equal to m:n.

A transparent electroconductive film showing a resistivity relatively close to that of a semimetal film resistor such as a Bi film resistor may alternatively be used for the purpose of the present invention. An ITO film or a ZnO film having a profile similar to the above-described one may be employed in this example.

Thus, the laser device of this example can substantially uniformly distribute the voltage applied thereto to the cascade-connected active regions with connecting regions interposed among them to improve the current injection efficiency and hence the laser oscillation characteristics of the quantum cascade laser.

Example 2

Figure 5:
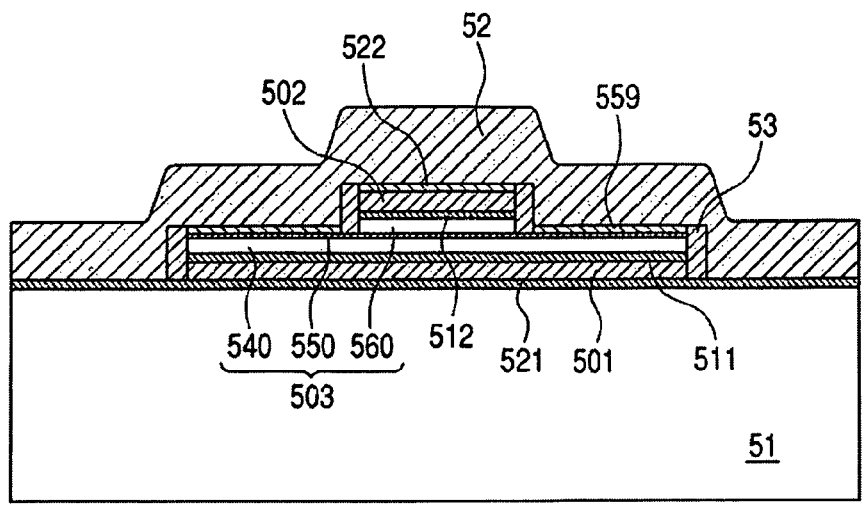
FIG. 5 is a schematic cross sectional view of the laser device of Example 2, illustrating the configuration thereof.
Figure 6:
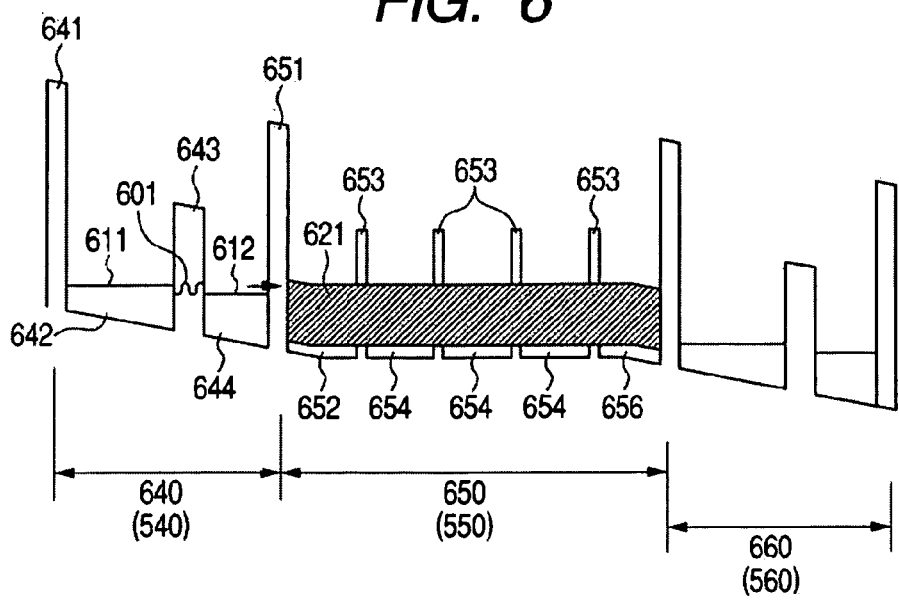
FIG. 6 is a diagram illustrating the band profile of the conduction band structure of the laser device of Example 2.

FIG. 5 is a schematic cross sectional view of the laser device of Example 2 taken perpendicularly relative to the direction of propagation of electromagnetic wave. In this Example, the gain medium 503 has a configuration of repetitively arranging two active regions 540 and 560 that are formed by using three barrier layers for each and can be used for a resonant tunneling diode. Thus, there is a single connecting region 550 arranged between the active regions 540 and 560. The profile of the bands is designed as a multiple quantum well structure as illustrated in FIG. 6. As for these regions, a lattice-matched InGaAs well layer and a lattice-matched InAlAs layer or a lattice-unmatched AlAs barrier layer may be formed on an InP substrate.

More specifically, a semiconductor multilayer film structure as shown below may be arranged from the emitter side to the collector side as a unit of repetition.

AlAs 1.3 nm (641)/InGaAs 7.6 nm (642)/InAlAs 2.6 nm (643)/InGaAs 5.6 nm (644)/AlAs 1.3 nm (641)/InGaAs 5.4 nm (652)/InAlAs 0.6 nm (653)/InGaAs 5.4 nm (654)/InAlAs 0.6 nm (653)/InGaAs 5.4 nm (654)/InAlAs 0.6 nm (653)/InGaAs 5.4 nm (654)/InAlAs 0.6 nm (653)/InGaAs 5.4 nm (656)

Of the above, from the top layer to the 1.3 nm-thick AlAs 651 layer are active regions 540 and 560 and from the 1.3 nm-thick AlAs 651 layer to the bottom layer constitute a connecting region 550. The 5.4 nm-thick n-InGaAs 654 layer is a carrier-doped injector layer that employs a miniband 621 for cascade connection and shows a relatively high electron density of about $2 \times 10^{18}$ $cm^{-3}$. The other layers are undoped layers which are not intentionally doped.

In this example, the 5.4 nm-thick n-InGaAs layer 654 in the connecting region 550 is a draw-out layer. The carriers (electrons are chosen here) injected from the emitter produce an electric current showing a current density of about 90 kA/$cm^2$ when an electric field of about 40 kV/cm is uniformly applied to the above semiconductor multilayer film structure to produce a gain in a frequency range of the terahertz band due to photon-assisted tunneling. (Refer to Jpn. J. Appl. Phys., Vol. 40, 5251 (2001) for the relationship between photon-assisted tunneling and gain).

The contact layers 511 and 512 of the gain medium 503 are typically formed by means of a semiconductor film of n-InGaAs (50 nm thick) that is lattice-matched to the InP substrate. Electrons are chosen as carriers and Si is employed as dopant. An electron density of $2 \times 10^{18}$ $cm^{-3}$ is selected here.

The gain medium 503 is sandwiched between negative permittivity mediums 501 and 502, which are also formed by means of an n-InGaAs (100 nm thick) semiconductor film that is lattice-matched to the InP substrate and made to show an electron density of $1 \times 10^{19}$ cm$^{-3}$. The gain medium 503, the negative permittivity mediums 501 and 502 and the contact layers 511 and 512 are formed on the InP substrate typically by means of a semiconductor epitaxial growth. FIG. 5 illustrates the structure produced after transferring these epitaxial layers onto a transfer substrate 51. The InP substrate is already removed and the negative permittivity mediums 501 and 502 are held in contact with respective electrodes 521 and 522 typically made of Ti/Pd/Au.

However, it should be noted that only an example of structure that can be formed on an InP substrate is described above and the present invention is by no means limited thereto. A semiconductor multilayer structure of arranging InAs/AlAsSb or InAs/AlSb on an InAs substrate, arranging GaAs/AlGaAs on a GaAs substrate, arranging InGaAs/AlGaAsSb on an InP substrate or arranging Si/SiGe on an Si substrate is also feasible.

FIG. 6 illustrates how an electric current flows when a predetermined electric field is applied to such a cascade-connected resonant tunneling diode (gain medium 503). Referring to FIG. 6, electrons make a photon-assisted tunneling transition 601 from a subband 611 to another subband 612 in the active region 640 to emit light of a wavelength that corresponds to the energy gap between the subband 611 and the subband 612. Subsequently, the electrons in the subband 612 of the active region 640 are extracted into a connecting region 650. Then, the electrons that pass through the connecting region 650 are injected into the next active region 660 to repeat the same photon-assisted tunneling transition as it made in the active region 640. The population inversion of electrons is secured between the subband 611 and the subband 612 according to the quasi-Fermi distribution for electrons in the miniband 621 of the connecting region 650.

The surface plasmon waveguide as described above is typically made to show a length of 300 μm in the direction of propagation of surface plasmon and a width of 5 μm in a direction transversal to the above direction. The draw-out layer 654 is drawn out in the transversal direction by 20 μm. Then, the load resistance of the active regions 540 and 560 is of the order of 1Ω. A resistor showing a resistance lower than the load resistance may well be used for the resistor 52 as in Example 1. A ribbon-shaped Bi resistor arranged to cross the surface plasmon waveguide as illustrated in FIG. 5 is adopted here. Therefore, when the ribbon-shaped Bi film resistor 52 is made to show a thickness of 0.3 μm and a width (the length in the direction of propagation of surface plasmon) of 3 μm or more, the following results are obtained. Namely, both the resistance value between the electrode 511 and the electrode 559 and the resistance value between the electrode 522 and the electrode 559 are equal to each other and of the order of 0.1Ω or less so that the requirement of the formula 2 is satisfied. The passivation film 53 for protecting the lateral wall of the laser device has a film thickness of about 200 nm as in Example 1. Thus, the Bi film resistor 52 structurally suppresses formation of a high-field domain in the gain medium 503 as described above by referring to the embodiment. The passivation film 53 and the electrode 559 may typically be made of SiO$_2$ and Ti/Pd/Au respectively.

The laser device of this example can be prepared in a manner as described below. Firstly, n-InGaAs layers 502 and 512, an InGaAs/AlAs or InGaAs/InAlAs multiple quantum well layer 503 and n-InGaAs layers 511 and 501 are formed on an InP substrate by epitaxial growth using MBE or the like. Then, after forming an electrode 521 of Ti/Pd/Au by evaporation on the surface thereof, the InP substrate is polished to a thickness of about 120 μm. Thereafter, a 300 μm cubic chip is formed from the work by cleavage and then bonded to the Au thin film on a transfer substrate 51, on which the electrode 521 and the Ti/Au thin film are formed by evaporation, by way of a pressure bonding process. Alternatively, they may be bonded to each other by way of a heat bonding process, using solder of AuSn for example. Only the InP substrate is selectively etched out when the work is subjected to a wet etching process, using hydrochloric acid. Then, a mesa-shaped epitaxial layer is transferred onto the transfer substrate 51.

Subsequently, a 20 μm-wide mesa shape is produced by photolithography and dry etching until the underlying layer is exposed. Thereafter, a 5 μm-wide mesa shape is produced by etching to expose the draw-out layer 654, following a similar process. A Degilem may be used to measure the etching depth in-situ for the purpose of realizing a highly accurate etching process. A selective wet etching process may be adopted here.

As a result of the above-described process, a stripe-shaped waveguide having a cavity length of 300 μm and cleavage planes arranged at the opposite ends is formed. Subsequently, a SiO$_2$ film 53 is formed typically by plasma CVD and then the mesa-shaped epitaxial layer is exposed except the lateral wall. A lateral wall can be left by etching, opening a stripe-shaped window having a width of 20 μm or less by patterning. Additionally, a Ti/Pd/Au electrode 522 and another Ti/Pd/Au electrode 559 are formed respectively on the surface of the n-InGaAs layer 502 and on the surface of the draw-out layer 654 in the cascade connecting region 550 by way of a lift-off process. Finally, a Bi film resistor 52 is formed by way of evaporation to produce a complete device.

Alternatively, three or more than three active regions may be repetitively arranged as in Example 1. A resonant tunneling diode formed by using two barrier layers may be used for active regions instead of a resonant tunneling diode formed by using three barrier layers. With either arrangement, the resistor 52 suppresses formation of a high-field domain because carriers pass through multiple quantum well structure of the conduction band or the valence band, hence within a single band.

Thus, the laser device of this example can substantially uniformly distribute the voltage applied thereto to the cascade-connected active regions with connecting regions interposed among them to improve the current injection efficiency and hence the laser oscillation characteristics of the quantum cascade laser.

Example 3

Figure 7A:
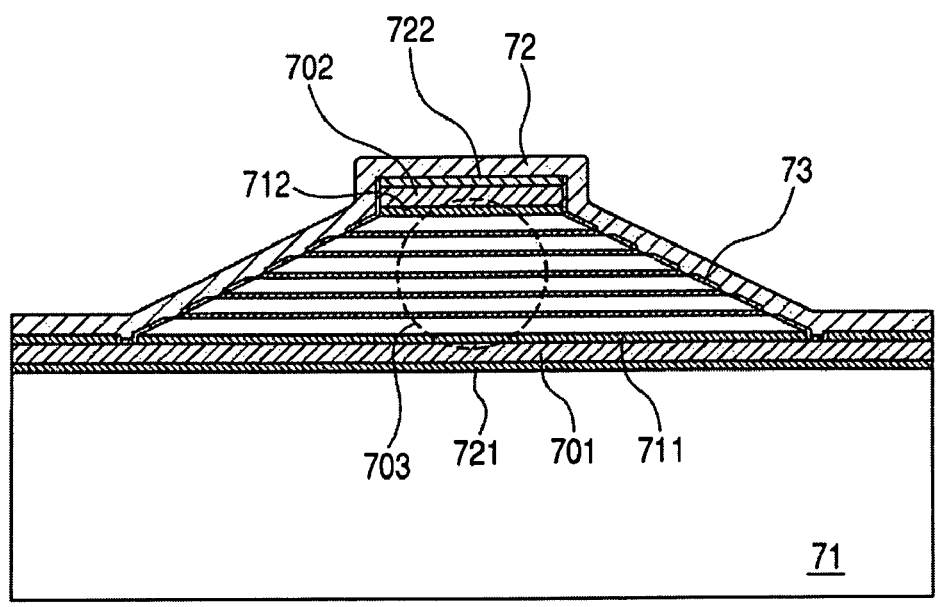
FIG. 7A is a schematic cross sectional view of the laser device of Example 3.
Figure 7B:
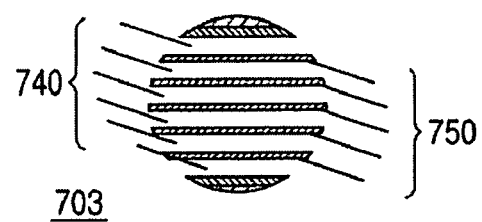
FIG. 7B is an enlarged view of the gain medium of the laser device of FIG. 7A.

FIG. 7A is a schematic cross sectional view of the laser device of Example 3, which is formed by modifying the laser device of Example 1, taken perpendicularly relative to the direction of propagation of electromagnetic wave, illustrating the configuration thereof. The gain medium 703 of this example is formed by repetitively arranging gain mediums 203 of Example 1 for n times (three times in the illustrated arrangement) (see FIG. 7B). The output power level of a quantum cascade laser is raised when the number of times of repetition is increased. Therefore, the device of this example is advantageous from such a point of view. Otherwise, the device of this example is the same as that of Example 1.

While the device of this example has a configuration substantially the same as the device of Example 1, the lateral wall of the device is forwardly tapered as illustrated in FIG. 7A because the resistor is arranged to accommodate the repetitive arrangement. At the same time, the resistor 72 is held in direct contact with the connecting regions 750. For this reason, poly-Si may advantageously be used for the resistor 72. The poly-Si film resistor 72 of this example can be formed by plasma CVD. The device can suppress formation of a high-field domain in the gain medium 703 when a ribbon-shaped resistor is formed so as to cross the surface plasmon waveguide as in Example 1. The resistance values of the resistor 72 arranged between adjacent pairs of cascade connecting regions 750 are made substantially equal to each other so as to equally divide the voltage applied to the device by external field application for the active regions 740.

The device of this example is characterized by the forwardly tapered profile thereof. Such a profile can be produced by defining a waveguide in the forward direction of the mesa stripe and conducting a wet etching process using a mixed aqueous solution of sulfuric acid and hydrogen peroxide or alternatively a dry etching process, forming a tapered resist layer. Any known appropriate techniques can be used to form a passivation film 73 for protecting the lateral wall, a resistor 72 and electrodes 721 and 722. In FIG. 7A, numeral 71 denotes a transfer substrate and numerals 701 and 702 denote respectively negative permittivity mediums, while numerals 711 and 712 denote respectively contact layers.

Example 4

Figure 8A:
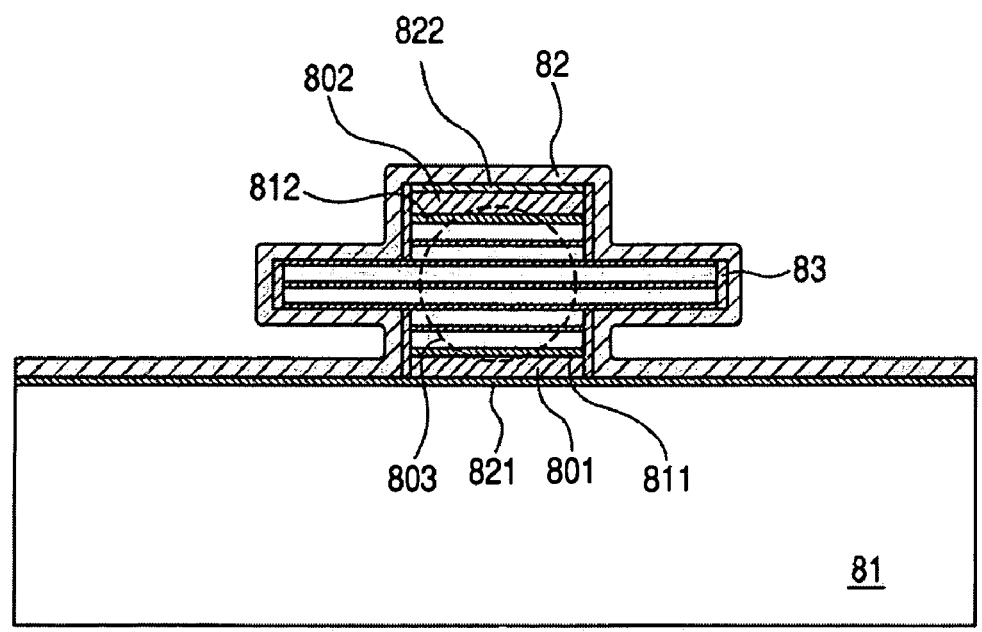
FIG. 8A is a schematic cross sectional view of the laser device of Example 4.

FIG. 8A is a schematic cross sectional view of the laser device of Example 4, which is formed by modifying the laser device of Example 3, taken perpendicularly relative to the direction of propagation of electromagnetic wave, illustrating the configuration thereof. The gain medium 803 of this example is formed by repetitively arranging gain mediums 203 of Example 1 for n times (see FIG. 8B). Additionally, the transverse mode of surface plasmon is shaped to reduce the waveguide loss in this example. Therefore, the device of this example is advantageous from such a point of view. Otherwise, the device of this example is the same as that of Example 3.

While the device of this example is formed substantially in the same manner as in Example 1, the lateral wall is made to show a constriction as illustrated in FIG. 8A in order to form the resistor 82, while shaping the transverse mode of surface plasmon. As the same time, the resistor 82 is held in direct contact with the cascade connecting regions 850. For this reason, poly-Si may advantageously be used for the resistor 82. The poly-Si film resistor 82 of this example can be formed by plasma CVD. The device can suppress formation of a high-field domain in the gain medium 803 when a ribbon-shaped resistor is formed so as to cross the surface plasmon waveguide as in Example 1.

Figure 8B:
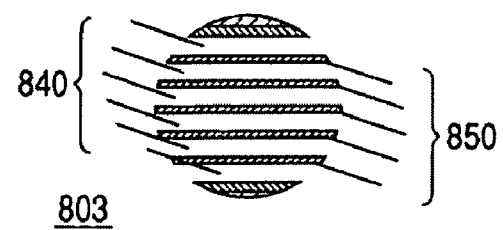
FIG. 8B is an enlarged view of the gain medium of the laser device of FIG. 8A.

The device of this example is characterized by its constricted profile. To produce such a profile, the mesa at the side of the negative permittivity medium 801 is prepared in advance and the bonding operation is conducted at the top of the mesa. Otherwise, the process of preparing a device of Example 1 may be followed. The lateral wall can also be formed at the constricted part of the mesa when CVD is employed for forming the resistor 82. In FIG. 8A, numerals 81 and 83 respectively denote a transfer substrate and a passivation film and numerals 801 and 802 denote respectively negative permittivity mediums, while numerals 811 and 812 denote respectively contact layers and numerals 821 and 822 denote respectively electrodes. In FIG. 8B, 840 denotes an active region.

In the above-described examples, the surface plasmon waveguide that provides a cavity structure may be of the Fabry-Perot type having end facets in the direction of propagation of electromagnetic wave. However, as is known in the field of semiconductor lasers, the DFB type of modulating a stripe in the direction of propagation or a DBR type of distributing reflecting surfaces in the direction of propagation may also be feasible for the purpose of the present invention. Other than planar end facets may be employed for termination of the surface plasmon waveguide. For example, a $\lambda/4$ impedance transformer may be provided to reduce the mismatching relative to the external space as is known in the field of microwave technologies. To do this, the waveguide may be tapered for $\lambda/4$ from each terminal. Alternatively, as is known in the field of optical technologies, provision of an AR coat formed for $\lambda/4$ from each terminal may also be feasible.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-331275, filed on Dec. 25, 2007, which is hereby incorporated by reference herein in its entirety.

What is claimed is:

1. A device for oscillating electromagnetic waves, comprising:
    a gain medium; and
    a first clad and a second clad sandwiching said gain medium,
    wherein said gain medium includes:
        active regions each having a quantum well structure for generating electromagnetic waves, and
        a connecting region positioned between said active regions to connect said active regions,
    wherein an electrical connection comprising a resistor but not comprising any of said active regions is provided between said connecting region and said first clad in parallel with at least one of said active regions, and
    wherein said active regions generate electromagnetic waves having substantially a same frequency.

2. The device according to claim 1, wherein said active regions have a same multilayer structure.

3. The device according to claim 2, wherein said active regions have different areas from each other.

4. The device according to claim 1, wherein each of said first clad and said second clad includes a negative permittivity medium, a real part of a permittivity thereof being negative relative to the electromagnetic waves.

5. The device according to claim 1, further comprising a substrate on which at least some parts of said device are arranged, and wherein said connecting region includes a draw-out layer drawn out in an in-plane direction of said substrate and electrically connected to said resistor.

6. The device according to claim 5, wherein said draw-out layer is carrier-doped and has a finite sheet resistance.

7. The device according to claim 1, wherein said resistor is a film resistor formed of an electroconductive material.

8. The device according to claim 1, wherein said resistor is formed of a semimetal, a transparent electroconductive film, or a semiconductor.

9. The device according to claim 4, wherein said negative permittivity medium is formed by a metal, a carrier-doped semiconductor, or a metal and a carrier-doped semiconductor.

10. The device according to claim 1, wherein said active regions include a resonant tunneling diode that exhibits a photon-assisted tunneling phenomenon.

11. The device according to claim 1, wherein the electromagnetic waves have a frequency within a range extending from 30 GHz to 30 THz.

* * * * *